US007095662B2

(12) United States Patent
Takeuchi et al.

(10) Patent No.: US 7,095,662 B2
(45) Date of Patent: Aug. 22, 2006

(54) SEMICONDUCTOR MEMORY DEVICE HAVING FIRST AND SECOND MEMORY CELL ARRAYS AND A PROGRAM METHOD THEREOF

(75) Inventors: Hideki Takeuchi, Kanagawa-ken (JP); Takuya Fujimoto, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 13 days.

(21) Appl. No.: 11/075,669

(22) Filed: Mar. 10, 2005

(65) Prior Publication Data

US 2005/0270817 A1 Dec. 8, 2005

(30) Foreign Application Priority Data

Jun. 8, 2004 (JP) ............................. 2004-170157
Jan. 6, 2005 (JP) ............................. 2005-001291

(51) Int. Cl.
*G11C 7/00* (2006.01)
(52) U.S. Cl. ............ 365/200; 365/189.05; 365/230.06; 365/230.03
(58) Field of Classification Search ................ 365/200, 365/230.06, 189.05, 230.03
See application file for complete search history.

(56) References Cited

U.S. PATENT DOCUMENTS 5,838,610 A 11/1998 Hashimoto
6,335,883 B1 1/2002 Fukuda et al.
6,373,746 B1 4/2002 Takeuchi et al.
6,839,272 B1* 1/2005 Ooishi ........................ 365/171
6,947,315 B1* 9/2005 Iwata .......................... 365/158
2006/0083064 A1* 4/2006 Edahiro et al. ........ 365/185.17

* cited by examiner

*Primary Examiner*—Tuan T. Nguyen
(74) *Attorney, Agent, or Firm*—Oblon, Spivak, McClelland, Maier & Neustadt, P.C.

(57) ABSTRACT

A semiconductor memory device including: a first memory cell array including a plurality of memory cells, a first switch circuit for transferring data to be programmed to at least one of the plurality of memory cells arranged in the first memory cell array, a latch circuit for latching the data transferred from the first switch circuit, a first write selector circuit for transferring the data transferred from the latch circuit, a first bit line connected to at least one of the plurality of memory cells and receiving the data transferred from the first write selector circuit, a second memory cell array including a plurality of memory cells that are different from the plurality of memory cells arranged in the first memory cell array, a second switch circuit for transferring data to be programmed to at least one of the plurality of memory cells arranged in the second memory cell array, a second write selector circuit connected to the second switch circuit and transferring the data transferred from the second switch circuit, and a second bit line connected to at least one of the plurality of memory cells arranged in the second memory cell array.

19 Claims, 12 Drawing Sheets

SEMICONDUCTOR MEMORY DEVICE HAVING FIRST AND SECOND MEMORY CELL ARRAYS AND A PROGRAM METHOD THEREOF

CROSS-REFERENCE TO RELATED APPLICATION

This application is based upon and claims the benefit of priority from the prior Japanese Patent Application No. 2005-001291, filed Jan. 6, 2005 and Japanese Patent Application No. 2004-170157 filed Jun. 8, 2004, the entire contents of which are incorporated herein by reference.

BACKGROUND OF THE INVENTION

1. Field of the Invention

This present invention relates to a semiconductor memory device having a first memory cell array that is used as a regular memory cell array and a second memory cell array a capacity of which is smaller than that of the first memory cell array.

2. Description of the Related Art

As a type of nonvolatile semiconductor memories, there has been heretofore proposed a flash memory capable of electrically erasing data all at once or block by block. In this flash memory, if data is written page by page, it is required to set more data in a memory cell than in an internal bus. For example, when the size (width) of the internal bus is 32 bits and that of data from the outside is 32 bits×64 words=2048 bits, this data of 2048 bits is on the same word line, and this data has to be written into a memory cell at a time. Thus, in order to hold lots of data, a program circuit for the memory cell is required to include a latch circuit for writing (for example, see FIG. 2 of Patent Document 1, Japanese Patent Laid-Open No. Hei 10 (1998)-55688, and the like). However, if the latch circuit for writing is provided, a cell area is increased for this latch circuit. Consequently, in a conventional semiconductor memory, it is difficult to reduce the cell area while realizing processing of vast quantities of data. With reference to the drawings, embodiments of the present invention will be described below. In the description, common components are denoted by common reference numerals and codes throughout the drawings.

SUMMARY OF INVENTION

A first aspect of the present invention is providing a semiconductor memory device comprising: a first memory cell array including a plurality of memory cells, a first switch circuit for transferring data to be programmed to at least one of the plurality of memory cells arranged in the first memory cell array, a latch circuit for latching the data transferred from the first switch circuit, a first write selector circuit for transferring the data transferred from the latch circuit, a first bit line connected to at least one of the plurality of memory cells and receiving the data transferred from the first write selector circuit, a second memory cell array including a plurality of memory cells that are different from the plurality of memory cells arranged in the first memory cell array, a second switch circuit for transferring data to be programmed to at least one of the plurality of memory cells arranged in the second memory cell array, a second write selector circuit connected to the second switch circuit and transferring the data transferred from the second switch circuit, and a second bit line connected to at least one of the plurality of memory cells arranged in the second memory cell array.

A second aspect of the present invention is providing a semiconductor memory device including first and second regions comprising: the first region having a plurality of groups, each of which including 1) a first memory cell array including a plurality of memory cells, 2) a first readout circuit receiving data read out from the first memory cell array, 3) a first program circuit receiving a first data to be programmed to the plurality of memory cells arranged in the first memory cell array, and 4) a first decoder circuit controlling the first memory cell array, and the second region having at least one group having 1) a second memory cell array including a plurality of memory cells, 2) a second readout circuit receiving data read out from the second memory cell array, 3) a second program circuit receiving a second data to be programmed to the plurality of memory cells arranged in the second memory cell array, and 4) a second decoder circuit controlling the second memory cell array, wherein the first program circuit including 1) a plurality of first switch circuits receiving the first data to be programmed to the plurality of memory cells arranged in the first memory cell array, 2) a plurality of latch circuits storing temporally the first data transferred from the plurality of first switch circuits, and 3) a plurality of first write selector circuits receiving the first data transferred from the plurality of latch circuits, wherein the second program circuit including 1) a plurality of second switch circuits receiving the second data to be programmed to the plurality of memory cells arranged in the second memory cell array and 2) a plurality of second write selector circuits, each of which is connected to corresponding each of the plurality of second switch circuits.

A third aspect of the present invention is providing a method for programming data to a semiconductor memory device comprising: receiving at least two data from outside of the semiconductor memory device, transferring the at least two data to latch circuits, retaining the at least two data in the latch circuits, programming the at least two data that are retained in the latch circuits, to first memory cells arranged in a first memory cell array at one time, receiving a second data from outside of the semiconductor memory device, transferring the second data, and programming the second data to a second memory cell arranged in a second memory cell array without waiting an arrival of another data to be programmed to the second memory cell array, wherein a capacity of the first memory cell array is greater than that of the second memory cell array.

A fourth aspect of the present invention is providing a method for programming data to a semiconductor memory device comprising: receiving a first data from outside of the semiconductor memory device, transferring the first data to a latch circuit, retaining the first data in the latch circuit, programming the first data that is retained in the latch circuit, to a first memory cell arranged in a first memory cell array, receiving a second data from outside of the semiconductor memory device, transferring the second data, and programming the second data to a second memory cell arranged in a second memory cell array without waiting an arrival of another data to be programmed to the second memory cell array, wherein a capacity of the first memory cell array is greater than that of the second memory cell array.

A fifth aspect of the present invention is providing a method for programming data to a semiconductor memory device comprising: receiving a first data from outside of the semiconductor memory device, transferring the first data to a latch circuit, retaining the first data in the latch circuit, programming the first data that is retained in the latch circuit, to a first memory cell arranged in a first memory cell array, receiving a second data from outside of the semiconductor memory device to a switch circuit, transferring the second data from the switch circuit to a write selector circuit directly, and programming the second data to a second memory cell arranged in a second memory cell array, wherein a capacity of the first memory cell array is greater than that of the second memory cell array.

DETAILED DESCRIPTION OF THE INVENTION

FIRST EMBODIMENT

Figure 1:
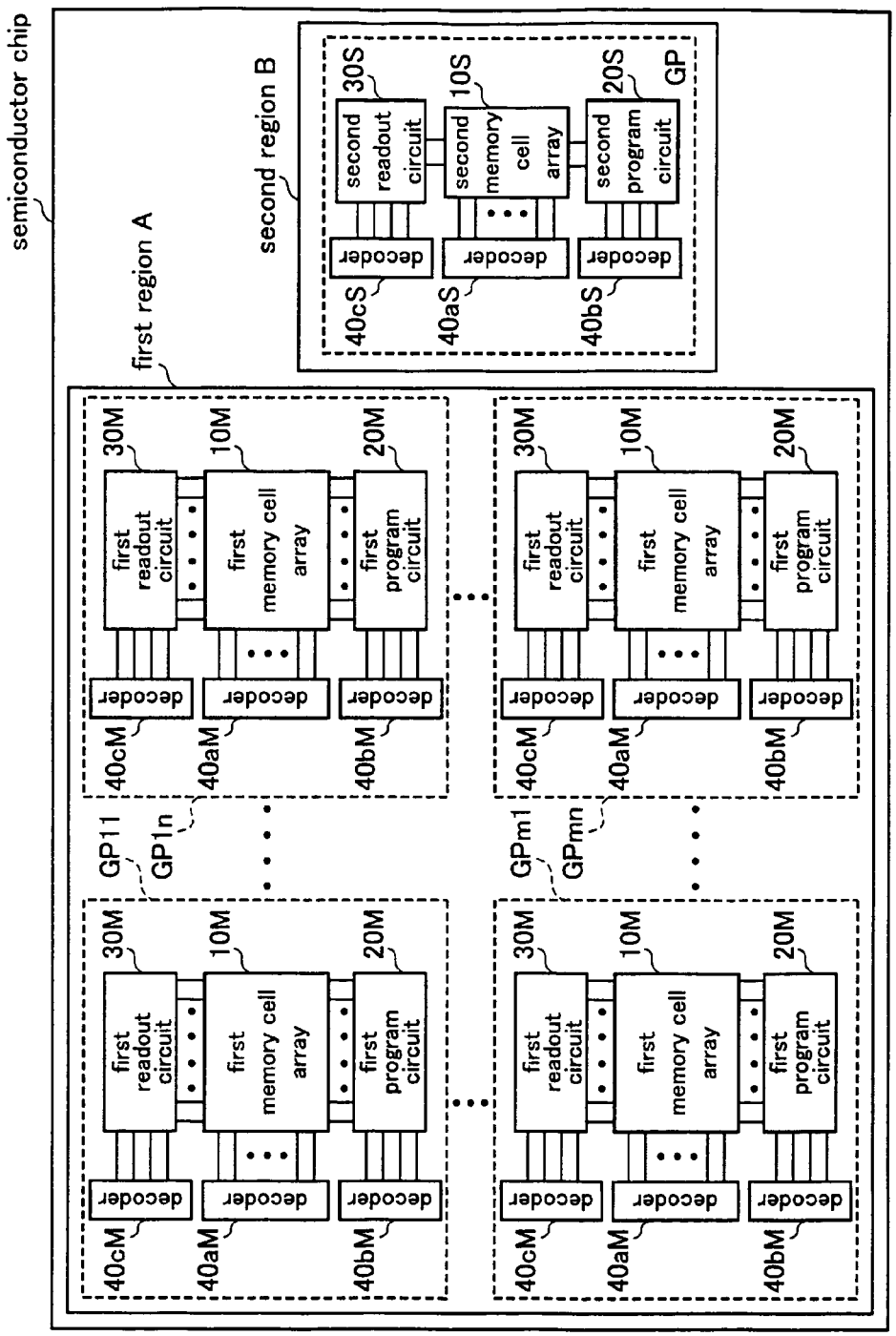
FIG. 1 shows an exemplary ship layout of a semiconductor chip of an embodiment in the present invention.

FIG. 1 is a schematic block diagram showing a semiconductor chip of a nonvolatile semiconductor memory according to a first embodiment of the present invention. General description will be given below of the nonvolatile semiconductor memory according to the first embodiment.

As shown in FIG. 1, the semiconductor chip of the nonvolatile semiconductor memory according to the first embodiment includes a first region A and a second region B. The first region A has a plurality of groups GPxy (x=1, 2, 3, . . . m, and y=1, 2, 3, . . . n), each group including a first memory cell array 10M, a first program circuit 20M, a first readout circuit 30M, and decoders 40aM, 40bM and 40cM.

The second region B has a group GP including a second memory cell array 10S, a second program circuit 20S, a second read circuit 30S, and decoders 40aS, 40bS and 40cS.

The first program circuit 20M and the first readout circuit 30M are used for write and read operations to memory cells arranged in the first memory cell array 10M, respectively. The second program circuit 20S and the second read circuit 30S are used for write and read operations to memory cells arranged in the second memory cell array 10S, respectively. The decoders 40aM and 40aS are used for selection of the memory cells arranged in the first and second memory cell arrays 10M and 10S, respectively. The decoders 40bM and 40bS are used for selection of write selectors 33M and 33S, which will be described later, of the first and second program circuits 20M and 20S, respectively. The decoders 40cM and 40cS are used for selection of read selectors 29M and 29S, which will be described later, of the first and second read circuits 30M and 30S, respectively.

Figures 2A, 2B:
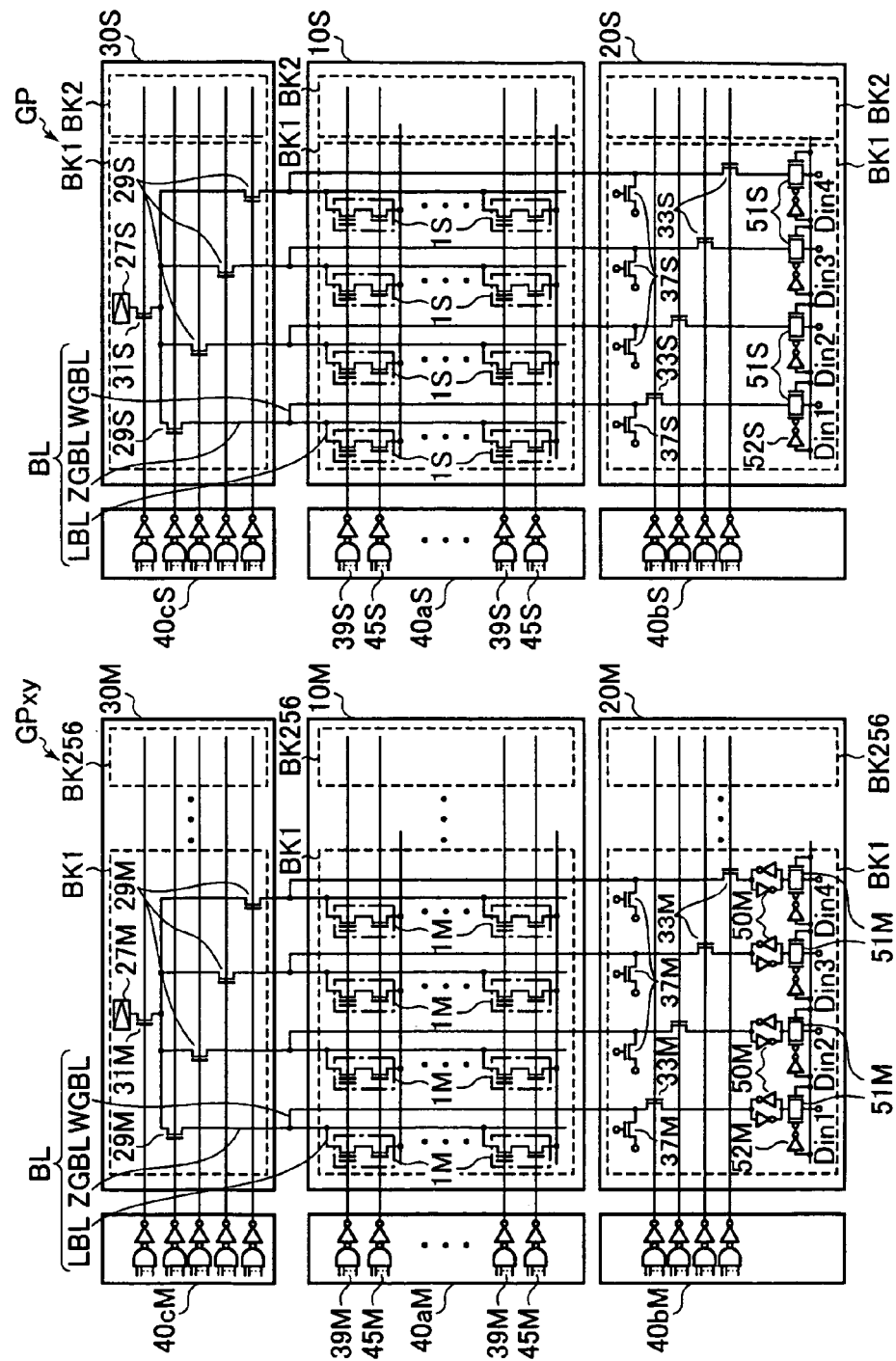
FIGS. 2a–2b shows circuit diagrams arranged in groups GPxy and GP.

FIG. 2a shows a schematic circuit diagram of one of the groups GPxy in the first region of the semiconductor chip shown in FIG. 1. FIG. 2b shows a schematic circuit diagram of the group GP in the second region of the semiconductor chip shown in FIG. 1. General description will be given below of the one of the groups GPxy and the group GP in the first and second regions.

As shown in FIGS. 2a and 2b, the first memory cell array 10M has a plurality of first memory cells 1M, and the second memory cell array 10S has a plurality of second memory cells 1S. Here, the plurality of first memory cells 1M has the same configuration, and the plurality of second memory cells 1S has the same configuration. However, the configuration of the plurality of first memory cells 1M may not be same. And also, the configuration of the plurality of first memory cells 2M may not be same.

The first program circuit 20M includes the write selectors 33M, write inhibiting circuits 37M, latch circuits 50M, write switches 51M, and inverters 52M. Meanwhile, the second program circuit 20S includes the write selectors 33S, write inhibiting circuits 37S, write switches 51S, and inverters 52S. Therefore, although the first program circuit 20M includes the latch circuits 50M, the second program circuit 20S includes no latch circuits.

The first readout circuit 30M includes sense amplifier circuits 27M, the read selectors 29M, and isolation transistors 31M. Similarly, the second read circuit 30S includes sense amplifier circuits 27S, the read selectors 29S, and isolation transistors 31S.

Note that, as shown in FIG. 2a, each of the groups GPxy includes a plurality of blocks, for example, 256 blocks BK1 to BK256. Each of the blocks BKa (a=1, 2, 3, . . . , 256) includes the first memory cell array 10M, the first program circuit 20M, and the first readout circuit 30M. The first memory cell arrays 10M in the blocks BKa have the same circuit configuration. The first program circuits 20M in the blocks BKa have the same circuit configuration. The first readout circuits 30M in the blocks BKa have the same circuit configuration.

Moreover, as shown in FIG. 2b, the group GP includes a plurality of blocks, for example, two blocks BK1 and BK2. Each of the blocks BKb (b=1, 2) includes the second memory cell array 10S, the second program circuit 20S, and the second read circuit 30S. The second memory cell arrays 10S in the blocks BKb have the same circuit configuration. The second program circuits 20S in the blocks BKb have the same circuit configuration. The second read circuits 30S in the blocks BKb have the same circuit configuration.

One of the blocks BKa is formed of, for example, four bit lines BL, and one of the blocks BKb is formed of, for example, four bit lines BL. These bit lines BL include global bit lines WGBL and ZGBL and a local bit line LBL, and have a double bit-line structure. The local bit line LBL is used for each cell, and the global bit lines WGBL and ZGBL are shared by a plurality of memory cells.

As shown in FIG. 2a, the write global bit line WGBL is connected to the program circuit 20M, the read global bit line ZGBL is connected to the read circuit 30M, and the local bit line LBL is connected to the global bit lines WGBL and ZGBL and the memory cell 1M. The write global bit line WGBL sends data to be programmed on a write terminal Din to the memory cell 1M through the write selector 33M. The read global bit line ZGBL sends data stored in the memory cell 1M to the sense amplifier 27M through a read selector 29M. Here, although each of the blocks BKa and BKb is formed of four bit lines BL and each of the bit line BL includes the global bit lines WGBK and ZGBL and the local bit line LBL, different configurations may be used. For instance, each of the blocks BKa and BKb may be formed of a certain number of bit line(s) other than four. And also, each of the bit line BL may include different structure other than the double bit line structure.

As shown in FIG. 2b, a write global bit line WGBL is connected to the program circuit 20S, a read global bit line ZGBL is connected to the read circuit 30S, and the local bit line LBL is connected to the global bit lines WGBL and ZGBL and the memory cell 1S. The write global bit line WGBL sends write data on a write terminal Din to the memory cell 1S through the write selector 33S. The read global bit line ZGBL sends read data to the sense amplifier 27S through a read selector 29S.

Here, the first memory cell array 10M includes, for example, 256 blocks BK1 to BK256 and has 1024 bit lines BL in total. The first memory cell array 10M has, for example, a 16 MB storage capacity, and includes hundreds of thousands to millions of the memory cells 1M.

Meanwhile, the second memory cell array 10S includes, for example, two blocks BK1 and BK2 and has 8 bit lines BL in total. The second memory cell array 10S has several bits (for example, 30 bits) of capacity. Moreover, since no latch circuits are included in the program circuit 20S, write data is not retained in the second memory cell array 10S and is directly written to each bit.

Moreover, the second memory cell array 10S has a storage capacity smaller than that of the first memory cell array 10M, for example. Accordingly, the second memory cell array 10S is used, for example, as (a) a defective address storage circuit or (b) a resistor circuit as described below.

First, description will be given of a case where the second memory cell array 10S is used as (a) the defective address storage circuit. In the semiconductor chip, aside from normally used memory cells (the first memory cell arrays 10M), spare redundant cells may be included. This is because, if some of the first memory cells 1M in the first memory cell array 10M are defective, the defective first memory cells 1M are replaced with the redundant cells. This is a so-called redundancy technique. In order to specify, for example, the defective first memory cells 1M by use of this redundancy technique, defective addresses have to be specified. This is because, if the defective addresses are unknown, the defective cells cannot be replaced with the redundant cells. Accordingly, the defective addresses are stored in the second memory cell array 10S. As described above, the second memory cell array 10S in this embodiment may be used as not only replacement cells to replace defective cells, but the defective address storage circuit which stores addresses of some of the first memory cells 1M that have been defective.

Next, description will be given of a case where the second memory cell array 10S is used as (b) the resistor circuit. The resistor circuit is a low-capacity memory which is provided in, for example, a microprocessor and is used to temporarily store data and addresses. For example, for every hardware function included in the microprocessor, a resistor circuit used for a specific purpose is provided. Meanings of data stored in this resistor circuit are uniquely determined by corresponding hardware functions. In an LSI circuit (Large-Scale Integrated Circuit) which mounts the nonvolatile semiconductor memory according to this embodiment, a CPU (Central Processing Unit), and the like, the second memory cell array 10S in this embodiment may be used as the resistor circuit which sets functions in the LSI circuit other than the nonvolatile semiconductor memory, such as a temporary storage of data (for example, results in the middle of operations/calculations by the CPU, and the like) from a circuit other than the nonvolatile semiconductor memory. Note that, for example, a user may store in the resistor circuit setting of write inhibition of a flash macro.

(2) First Memory Cell and Peripheral Circuit Thereof

Figure 3:
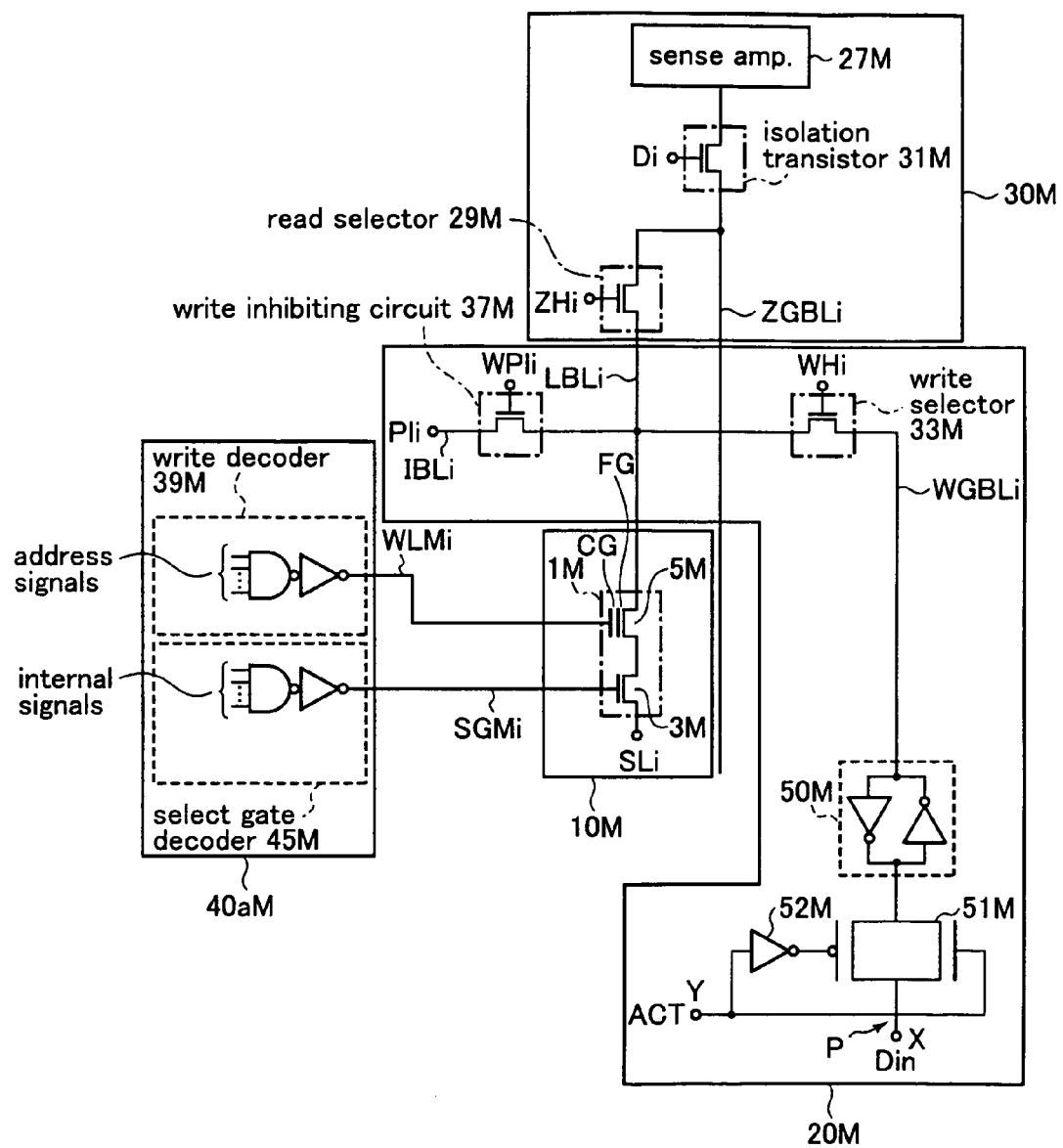
FIG. 3 shows a schematic circuit diagram of the group GPxy in a first embodiment of the present invention.

FIG. 3 shows a block diagram of a two-transistor type of a first memory cell and a peripheral circuit thereof according to the first embodiment of the present invention. The first memory cell and the peripheral circuit thereof according to the first embodiment will be described below. However, for simplification of the following description, some circuits are omitted.

As shown in FIG. 3, around the first memory cell 1M, the sense amplifier circuit 27M, the read selector 29M, the isolation transistor 31M, the write selector 33M, the write inhibiting circuit 37M, a write decoder 39M, a select gate decoder 45M, the latch circuit 50M, the write switch 51M, and the inverter 52M are provided.

The first memory cell 1M is a two-transistor flash memory cell, and includes a select transistor 3M and a cell transistor 5M which is serially connected to the select transistor 3M. The select transistor 3M is a normal MOS transistor. In this select transistor 3M, a source electrode thereof is connected to a source line SLi, a drain electrode thereof is connected to a source of the cell transistor 5M, and a gate electrode thereof is connected to a select gate line SGMi. The cell transistor 5M has a floating gate (a charge storage layer) FG and a control gate CG. In this cell transistor 5M, a drain electrode thereof is connected to a local bit line LBLi, and a gate electrode thereof is connected to a word line WLMi.

The select gate line SGMi is connected to the select gate decoder 45M, and the word line WLMi is connected to the write decoder 39M. The local bit line LBLi is connected to one end of a current path of the read selector 29M, and the other end of the current path of the read selector 29M is connected to a read global bit line ZGBLi. Moreover, the local bit line LBLi is connected to one end of a current path of the write selector 33M, and the other end of the current path of the write selector 33M is connected to a write global bit line WGBLi. Furthermore, the local bit line LBLi is connected to one end of a current path of the write inhibiting circuit 37M, and the other end of the current path of the write inhibiting circuit 33M is connected to an inhibit line IBLi. The read global bit line ZGBLi is connected to the sense amplifier circuit 27M through the isolation transistor 31M. The write global bit line WGBLi is connected to the latch circuit 50M. This latch circuit 50M is connected to the write switch 51M, and the write switch 51M is connected to an output terminal of the inverter 52M. The write switch 51M includes two transistors (for example, a PMOS transistor and an NMOS transistor) which are connected in parallel. Both ends of a current path of one of the transistors are connected to both ends of a current path of the other transistor.

In such a peripheral circuit of the first memory cell 1M, a read column select signal ZHi is supplied to a gate of the read selector 29M. In a read operation, when the read column select signal ZHi becomes, for example, an "H" level, the read selector 29M is turned on, and the local bit line LBLi is selected. On the contrary, when the read column select signal ZHi becomes, for example, an "L" level, the read selector 29M is turned off, and the local bit line LBLi is unselected.

A write column select signal WHi is supplied to a gate electrode of the write selector 33M. In a write operation, when the write column select signal WHi becomes, for example, an "H" level, the write selector 33M is turned on, and the local bit line LBLi is selected. On the contrary, when the write column select signal WHi becomes, for example, an "L" level, the write selector 33M is turned off, and the local bit line LBLi is unselected.

The write inhibiting circuit 37M applies a write inhibiting voltage PIi to the local bit line LBLi. A write inhibiting select signal WPIi is supplied to a gate electrode of the write inhibiting circuit 37M. In the write operation, when the write selector 33M is turned off, the write inhibiting select signal WPIi becomes, for example, an "H". level, and the write inhibiting circuit 37M is turned on. By turning on the write inhibiting circuit 37M, the write inhibiting voltage PIi is supplied to the unselected local bit line LBLi. The write inhibiting voltage PIi may be one which does not change a threshold of the cell transistor 5M and may be the same as, for example, a voltage when data "1" is written. In this example, the write inhibiting voltage PIi is 0V.

The isolation transistor 31M is a transistor of a high voltage resistance type, and an isolation signal Di is supplied to a gate electrode thereof. In an operation using high voltage, for example, in an erase operation and the write operation, this isolation signal Di becomes an "L" level, and the isolation transistor 31M is turned off. As described above, by turning off the isolation transistor 31M, application of high voltage to the sense amplifier circuit 27M is prevented. The sense amplifier circuit 27M amplifies data that is read on the global bit line ZGBLi from the first memory cell 1M.

The latch circuit 50M includes two inverters, for example, and latches (retains) a write data on the write terminal Din. Input of this write data to the latch circuit 50M is controlled by turning on or off the write switch 51M. The write switch 51M is controlled by use of an activation signal ACT, and transfers the write data. In the read operation, the select gate decoder 45M decodes address signals and determines select/unselect of the select gate line SGMi. When a potential of the select gate line SGMi becomes an "H" level, the select gate line SGMi is selected. On the contrary, when the potential of the select gate line SGMi becomes an "L" level, the select gate line SGMi is unselected.

In the write operation, the write decoder 39M decodes address signals and determines select/unselect of the word line WLMi. When a potential of the word line WLMi becomes an "H" level, for example, a write potential VPP (for example, 12V), the word line WLMi is selected. On the contrary, when the potential of the word line WLMi becomes an "L" level, for example, 0V, the word line WLMi is unselected.

(3) Second Memory Cell and Peripheral Circuit Thereof

Figure 4:
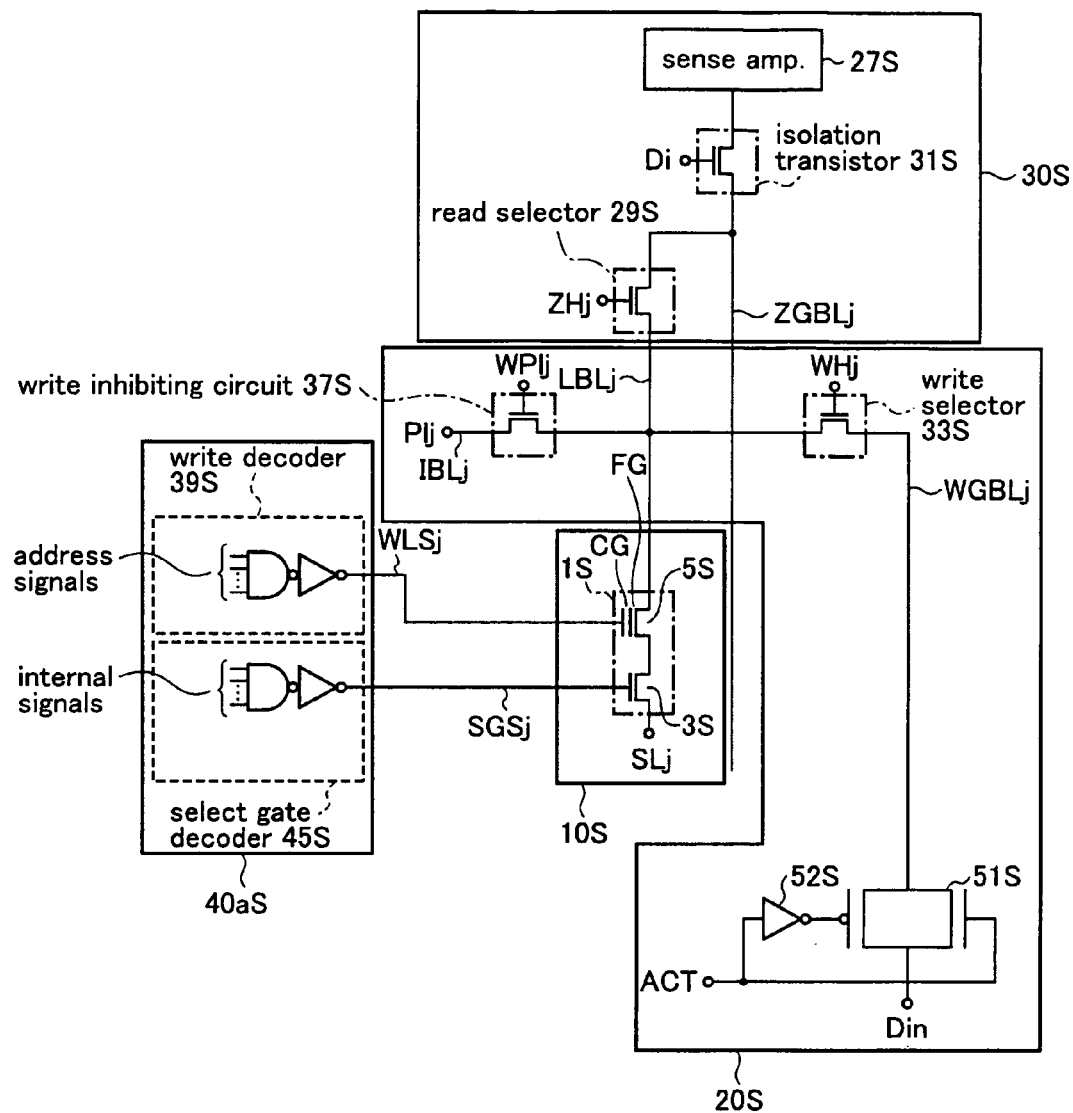
FIG. 4 shows a schematic circuit diagram of the group GP in a first embodiment of the present invention.

FIG. 4 shows a block diagram of a two-transistor type of a second memory cell and a peripheral circuit thereof according to the first embodiment of the present invention. The second memory cell and the peripheral circuit thereof according to the first embodiment will be described below. However, for simplification of the following description, some circuits are omitted.

As shown in FIG. 4, around the second memory cell 1S, the sense amplifier circuit 27S, the read selector 29S, the isolation transistor 31S, the write selector 33S, the write inhibiting circuit 37S, a write decoder 39S, a select gate decoder 45S, the write switch 51S, and the inverter 52S are provided.

Specifically, the peripheral circuit of the second memory cell 1S is different from the peripheral circuit of the first memory cell 1M in that no latch circuit for writing is provided therein. Therefore, the write switch 51S to which data on the write terminal Din is inputted is directly connected to a write global bit line WGBLj. Other than the points described above, the second memory cell 1S and the peripheral circuit thereof have the same configurations and operations as those of the first memory cell 1M and the peripheral circuit thereof. Thus, description thereof will be omitted.

Note that, although processing of large quantities of data page by page is required in the first memory cell 1M, data is not written page by page in the second memory cell 1S. Thus, the second memory cell 1S requires no latch circuit for writing.

(4) Read Operation/Write Operation/Erase Operation

Next, general description will be given of read, write and erase operations. Note that, in the following description, operations of both of the first and second memory cells 1M and 1S will be described. Thus, symbols such as "M" and "S" in the reference numerals will be omitted.

(Read Operation)

Figure 5A:
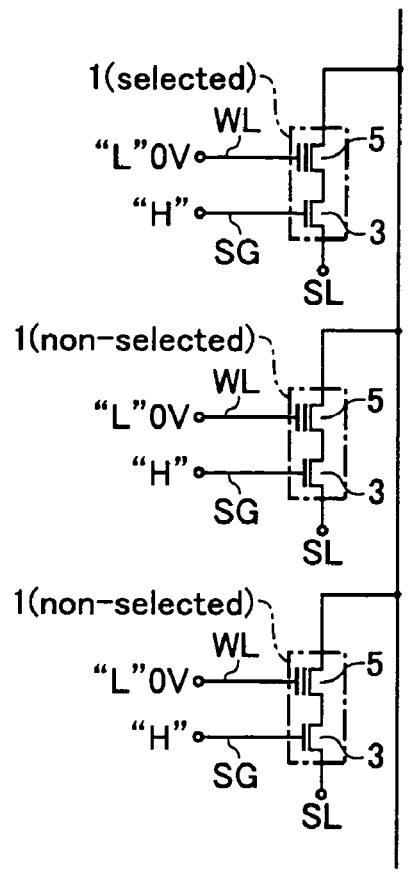
FIGS. 5a–5b shows a read operation of a nonvolatile memory device.
Figure 5B:
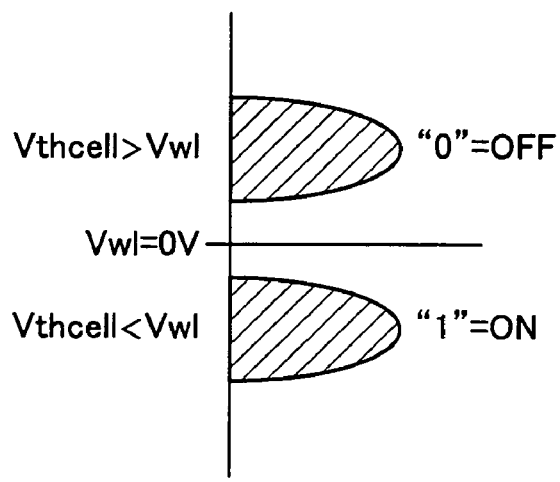

FIGS. 5(a) and 5(b) are views for explaining the read operation according to the first embodiment of the present invention. In reading of data, the memory cell 1 from which data is desired to be read is selected. The memory cell 1 is selected by controlling a potential of the select gate line SG. For example, as shown in FIG. 5(a), when the potential of the select gate line SG becomes an "H" level, the select transistor 3 is turned on, and the memory cell 1 is selected. On the contrary, when the potential of the select gate line SG is "L", the select transistor 3 is turned off, and the memory cell 1 is unselected.

In the reading of data, as shown in FIG. 5(a), a potential Vwl of all word lines WL is set to an "L" level, for example, 0V. In this event, if a threshold Vthcell of the cell transistor 5 is less than the potential Vwl of the word lines WL, for example, "Vthcell<0V," the cell transistor 5 is turned on (see FIG. 5(b)). On the contrary, if the threshold Vthcell exceeds the potential Vwl of the word lines WL, for example, "Vthcell>0V," the cell transistor 5 is turned off (see FIG. 5(b)). When the select transistor 3 is turned on, an amount of a current flowing between the bit line BL and the source line SL is changed depending on whether the cell transistor 5 is turned on or off. This change is detected by, for example, the sense amplifier circuit 27. Accordingly, it is determined whether the read data is "1" or "0." Note that, here, it is assumed that data when "Vthcell<0V" is "1", and data when "Vthcell>0V" is "0".

(Write Operation)

In writing of data, the memory cell 1 into which data is desired to be written is selected. The memory cell 1 is selected by controlling a potential of the word line WL. For example, if the potential of the word line WL is the write potential VPP (for example, 12V), the memory cell 1 connected to the word line WL is selected. On the contrary, when the potential of the word line WL is "L" (for example, 0V), the memory cell 1 connected to the word line WL is unselected. In the writing of data, the select gate line SG is not used to select the memory cell 1. In the writing of data, a potential of all the select gate lines SG is set to a negative potential VBB, for example, −8V. As a result, all the select transistors 3 are turned off.

Write data is given to the memory cell 1 from the bit line BL. When the write data is "1", a potential of the bit line BL becomes "1" level (for example, 0V), and a potential of a drain of the cell transistor 5 becomes 0V. Since a potential of a gate of the cell transistor 5 in the memory cell 1 selected for writing is 12V, a potential difference between the potential of the gate of the cell transistor 5 selected for writing and potentials of the drain and a channel is 12V.

On the contrary, when the write data is "0", the potential of the bit line BL becomes "0" level (for example, −8V), and the potentials of the drain and channel of the cell transistor 5 become −8V Accordingly, a potential difference between the potential of the gate of the cell transistor 5 selected for writing and the potentials of the drain and the channel is 20V.

Here, characteristics of the cell transistor 5 are set in the following manner. Specifically, a FN (Fowler-Nordheim) tunnel current flows toward the floating gate FG at the potential difference of 20V, and, meanwhile, no current flows at the potential difference of 12V. Thus, "1" data and "0" data can be separately written. In this example, since no electrons are injected into the floating gate FG when the write data is "1," the cell transistor 5 is maintained at "Vthcell<0V." On the contrary, since electrons are injected into the floating gate FG when the write data is "0," the cell transistor 5 is set to "Vthcell>0V."

Note that, in the write operation described above, the first program circuit 20M includes the latch circuit 50M. Thus, the write data is transferred by the write selector 33M after being latched once by the latch circuit 50M, and is written into the first memory cell 1M.

Meanwhile, the second program circuit 20S includes no latch circuit. Thus, the write data is transferred by the write selector 33S without being latched, and is directly written into the second memory cell 1S. Here, the write data is automatically set when the second memory cell 1S is selected. Specifically, the activation signal ACT is inputted to the program circuit (the write switch 51M and the inverter 52M).

(Erase Operation)

In erasing of data, the memory cell 1 from which data is desired to be erased is selected. The memory cell 1 is selected by controlling a potential of the word line WL. For example, if the potential of the word line WL is the negative potential VBB, for example, −8V, the memory cell 1 connected to the word line WL is selected. Meanwhile, when the word line WL is set to be in a floating state, the memory cell 1 connected to the word line WL is unselected. In the erasing of data, the select gate line SG is not used to select the memory cell 1. In the erasing of data, all the select gate lines SG are set to be in a floating state.

In the erasing of data, a potential of a well region in which the select transistor 3 and the cell transistor 5 are formed is set to an erase potential VEE, for example, 20V. Since a potential of a gate of the cell transistor 5 selected for erase is −8V, a potential difference between the potential of the gate of the cell transistor 5 selected for erase and a potential of a channel (the well region) is 28V.

Meanwhile, since a gate of the unselected cell transistor 5 is in a floating state, a potential of the gate of the unselected cell transistor 5 is 20V, which is the same as that of the well region, due to coupling with the well region. There is no potential difference between the gate of the unselected cell transistor 5 and the channel (the well region).

Therefore, in the cell transistor 5 having a potential difference of 28V between the gate and the channel (the well region), the FN tunnel current flows toward the well region, and the cell transistor 5 is set to "Vthcell<0V." Consequently, the data is "1" and is erased. In the cell transistor 5 having no potential difference between the gate and the channel (the well region), since no FN tunnel current flows, the data "1" or the data "0" is maintained.

According to the first embodiment of the present invention as described above, the memory cell arrays are divided into the first memory cell array 10M which requires a large capacity and the second memory cell array 10S which requires only a small capacity. In addition, although the latch circuit 50M is included in the first program circuit 20M of the first memory cell array 10M, no latch circuit for writing is included in the second program circuit 20S of the second memory cell array 10S. Thus, in the first memory cell array 10M, processing of large quantities of data in the case of writing page by page or the like can be realized by retaining data in the latch circuit 50M. At the same time, in the second memory cell array 10S, a cell area can be reduced compared to the case where the latch circuit is included therein. Furthermore, in the second memory cell array 10S, current consumption can be reduced and a writing speed can be increased compared to the case where the latch circuit is included therein.

SECOND EMBODIMENT

A second embodiment is an example where both of first and second memory cell arrays include one transistor type of the memory cells.

(1) First and Second Memory Cells and Peripheral Circuits Thereof

Figure 6:
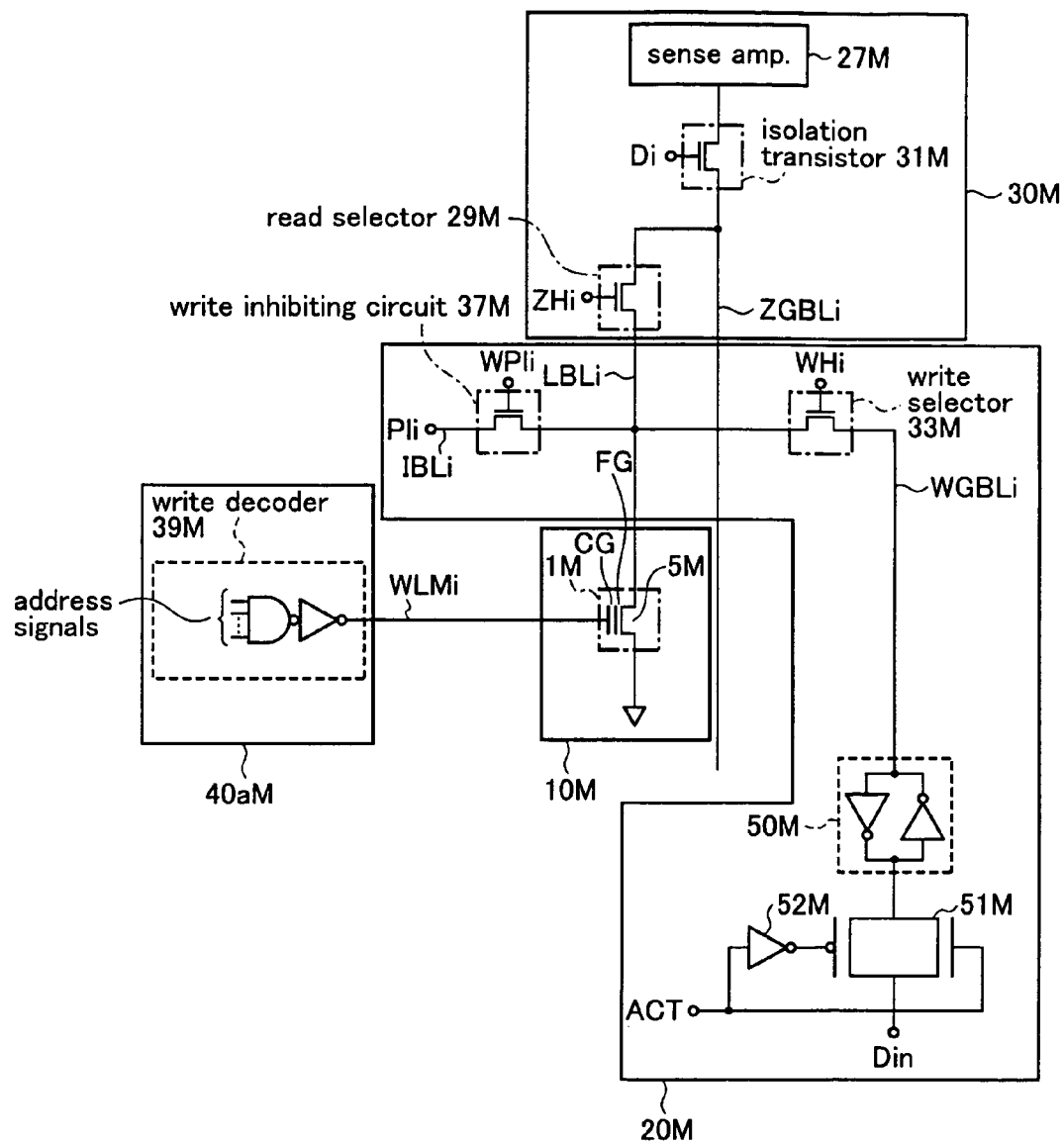
FIG. 6 shows a schematic circuit diagram of the group GPxy in a second embodiment of the present invention.
Figure 7:
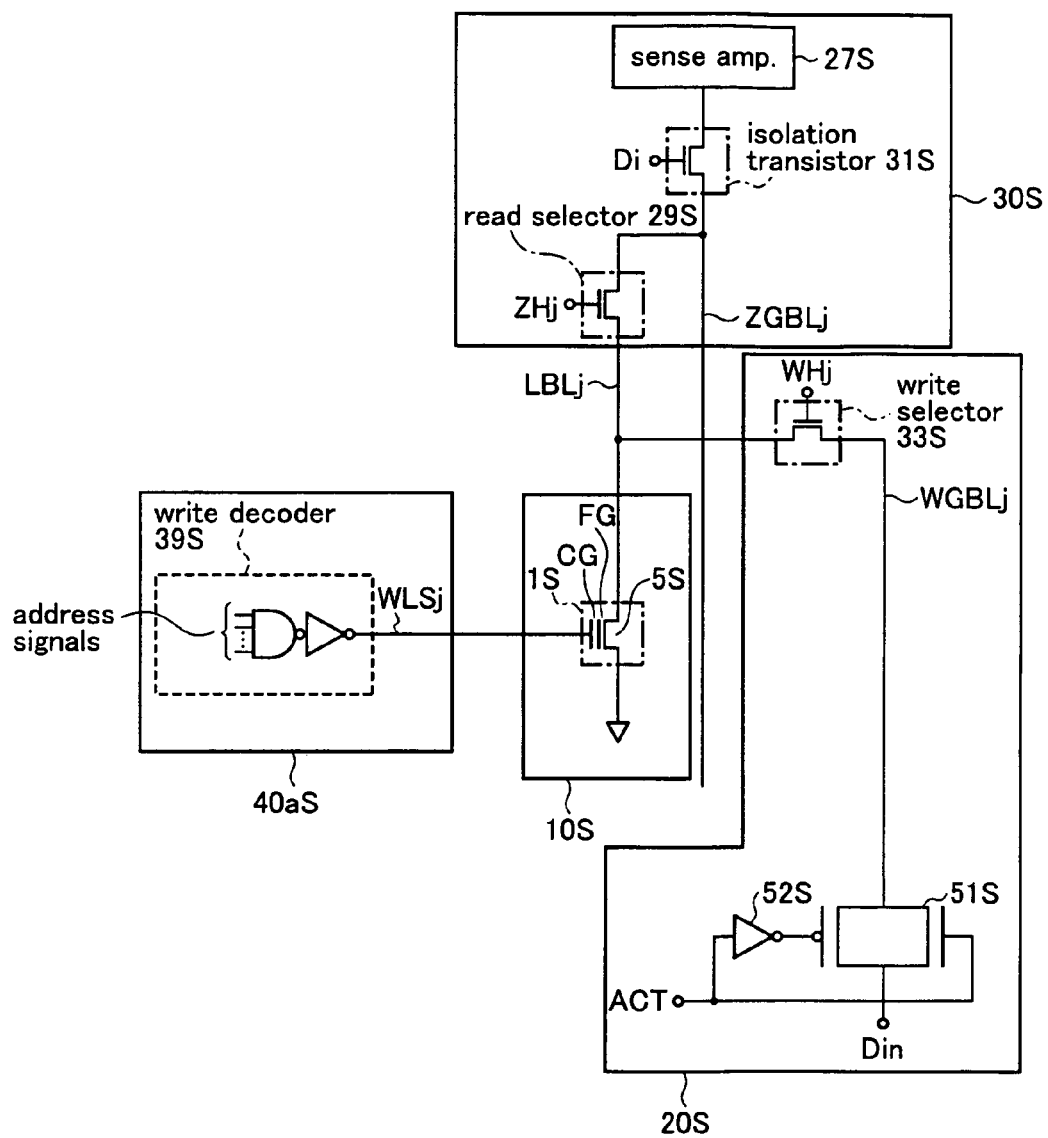
FIG. 7 shows a schematic circuit diagram of the group GP in a second embodiment of the present invention.

FIG. 6 shows a block diagram of one transistor type of a first memory cell and a peripheral circuit thereof according to the second embodiment of the present invention. FIG. 7 shows a block diagram of one transistor type of a second memory cell and a peripheral circuit thereof according to the second embodiment of the present invention. The first and second memory cells and the peripheral circuits thereof according to the second embodiment will be described below.

As shown in FIGS. 6 and 7, the second embodiment is different from the first embodiment in that the memory cells are a one-transistor type of memory cells and in that write inhibiting circuits and select gate decoders are not provided. To be more specific, the first and second memory cells 1M and 1S of the second embodiment are a one-transistor type of flash memory cells and include cell transistors 5M and 5S without select transistors provided therein. Thus, it is not required to provide the select gate decoders which control the select transistors. Here, in the one-transistor type of the memory cell, a threshold is changed based on whether or not electrons are injected into the floating gate FG, and data of "0" or "1" is stored according to this change of the threshold. Moreover, no write inhibiting circuit connected to the local bit line LBL is provided. This is because, in the case of the one-transistor type of the memory cell, no erroneous write occurs in an unselected memory cell in writing even if a drain of the memory cell is set to be in a floating state.

(2) Read Operation

Figure 8A:
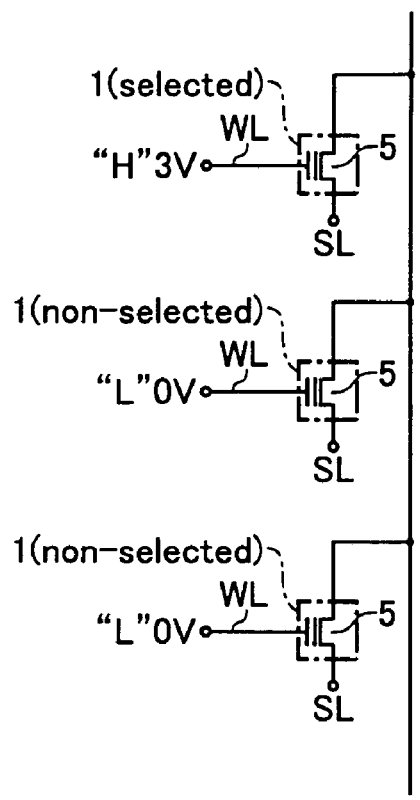
FIGS. 8a–8b shows another read operation of a nonvolatile memory device.
Figure 8B:
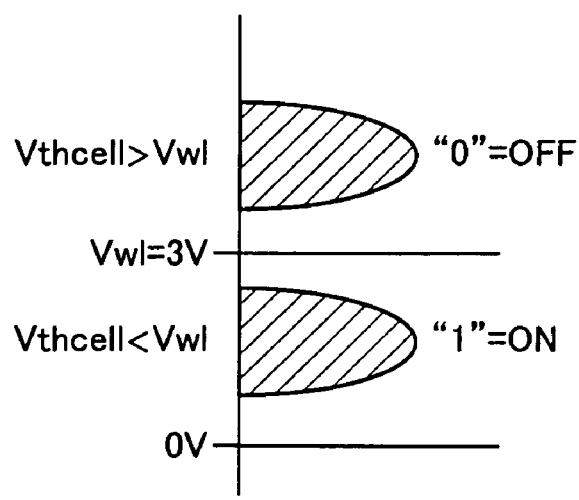

FIGS. 8(a) and 8(b) are views for explaining a read operation according to the second embodiment of the present invention.

In reading of data, the memory cell 1 from which data is desired to be read is selected by use of the word line WL. As shown in FIG. 8(a), a potential Vwl of the selected word line WL is set to a predetermined positive potential, for example, 3V, and a potential Vwl of the unselected word line WL is set to an "L" level, for example, 0V. In this event, a threshold Vthcell of the cell transistor 5 is less than the potential Vwl of the word line WL, for example, "Vthcell<Vwl," the cell transistor 5 is turned on (see FIG. 8-(b)). On the contrary, if the threshold Vthcell exceeds the potential Vwl of the word line WL, for example, "Vthcell>Vwl", the cell transistor 5 is turned off (see FIG. 8(b)). Here, an amount of a current flowing between the bit line BL and the source line SL is changed depending on whether the cell transistor 5 is turned on or off. This change is detected by, for example, the sense amplifier circuit 27. Accordingly, it is determined whether the read data is "1" or "0". Note that, here, it is assumed that data when "Vthcell<Vwl" is "1," and data when "Vthcell>Vwl" is "0."

According to the second embodiment of the present invention as described above, the same effects as those of the first embodiment can be achieved. Furthermore, since the one-transistor type of the memory cells are used as the memory cells 1M and 1S, a cell area can be further reduced.

THIRD EMBODIMENT

A third embodiment is an example where first and second memory cells have different memory cell structures from each other.

Specifically, since the first memory cell 1M requires a fast writing speed to handle large volumes of data, a two-transistor type of the memory cell having a data writing speed faster than that of a one-transistor type of the memory cell is employed. Meanwhile, the second memory cell 1S does not require such a fast writing speed since the memory cell handles a small volume of data. Thus, as the second memory cell 1S, a one-transistor type of the memory cell capable of reducing a layout area, compared to the two-transistor type of the memory cell, is employed.

Here, the two-transistor type of the memory cell has the data writing speed faster than that of the one-transistor type of the memory cell because of the following reasons. In the one-transistor type of the memory cell, normally, a threshold distribution of "1" data and a threshold distribution of "0" data are set to positive potentials of 0V or more, respectively (see FIG. 8(b)). Thus, the threshold distribution ΔVthcell of "1" data has to be strictly controlled to be within a narrow range of "unselected word line potential (for example, 0V)<ΔVthcell<selected word line potential (for example, 3V)." Consequently, in a write operation, a verify read operation is repeated to set the threshold distribution ΔVth-cell of "1" data into the narrow range described above. To be more specific, the write sequence includes the following three steps.

(1) Preprogramming Step (electrons are injected into floating gates of all memory cells, and data of all the memory cells are set to "0")

(2) Erase Step (the electrons are taken out of the floating gates of all the memory cells, and the data of all the memory cells are set to "1")

(3) Programming Step (electrons are injected into only the floating gates of the memory cells into which data "0" is written)

The erase step and the programming step are performed while thresholds are verified by executing the verify read. This is in order to bring the threshold distribution of "1" data into the narrow range described above. Furthermore, in the erase step, in order to avoid over erase, it is required to perform self convergence to bring the thresholds back to, for example, a level where the transistor is turned off at the unselected word line potential. For the reasons described above, the one-transistor type of the memory cell takes time in writing data.

On the other hand, a write sequence of the two-transistor type of the memory cell includes the following two steps.

(1) Erase Step (2) Programming Step

In the two-transistor type of the memory cell, the select transistor performs select and unselect of memory cells. Therefore, a threshold distribution of "1" data may be set to a word line potential in reading, for example, a negative potential of 0V or less, and a threshold distribution of "0" data may be set to a word line potential in reading, for example, a positive potential of 0V or more (see FIG. 5(b)). Particularly, unlike the one-transistor type of the memory cell, the threshold distribution ΔVthcell of "1" data does not have to be strictly controlled to be within the narrow range. Accordingly, the threshold distribution may be simply set to "A Vthcell<word line potential in reading (for example, 0V)." Thus, in verify read of the two-transistor type of the memory cell in the erase step, it is only necessary to determine whether or not the threshold of the memory cell is set to the word line potential in reading or less. Unlike the case of the one-transistor type of the memory cell, there is no need to determine in two modes, namely, whether or not the threshold of the memory cell is set to the selected word line potential or less and whether or not the threshold of the memory cell is set to the unselected word line potential or more. Furthermore, since no over erase occurs in the two-transistor type of the memory cell, no self convergence has to be executed. For the reasons described above, the two-transistor type of the memory cell has the data writing speed faster than that of the one-transistor type of the memory cell.

According to the third embodiment of the present invention as described above, the same effects as those of the first embodiment can be achieved.

Furthermore, as the first memory cell 1M, the two-transistor type of the memory cell is used. Thus, the data writing speed can be improved compared to the case where the one-transistor type of the memory cell is used. Moreover, in writing of data, since the electrons are injected into the floating gate by use of the FN tunnel current, a large current is not required. Therefore, compared to the case where the one-transistor type of the memory cell is used, power consumption can be reduced.

Meanwhile, in the second memory cell 1S, use of the one-transistor type of the memory cell makes it possible to reduce the cell area compared to the case where the two-transistor type of the memory cell is used.

Note that the nonvolatile semiconductor memories according to the first to third embodiments are not limited to the configurations shown in the drawings. For example, the following various changes can be made.

(a) In the respective embodiments described above, a multiple bit-line structure is adopted. Specifically, the double bit-line structure including the local bit line LBL and the global bit lines GBL is adopted. Therefore, the local bit line LBL is disposed in each cell, and the global bit lines GBL are disposed across the plurality of cells (the cell array). This is because one sense amplifier 27 is shared by the plurality of cells, and the cell area can be reduced.

However, in the respective embodiments described above, without being limited to the double bit-line structure, for example, the local bit line LBL can be connected to the sense amplifier 27 without provision of the global bit lines GBL.

(b) In the respective embodiments described above, the write switches 51 of the first and second program circuits 20M and 20S have the same configuration, and each of the switches includes the PMOS transistor and the NMOS transistor. This is because a simple manufacturing process can be realized by allowing the both switches to have the same configuration.

However, in the respective embodiments described above, without being limited to the structure in which the write switches 51 in the first and second program circuits 20M and 20S have the same configuration, the switches can have different configurations from each other. For example, in the first program circuit 20M in which write is strictly controlled such as retaining of data, the switch 51M may be formed of two transistors including the PMOS transistor and the NMOS transistor. Meanwhile, in the second program circuit 20S which does not require retaining of data, the switch 51S may be formed of one of the PMOS transistor and the NMOS transistor.

(c) In the respective embodiments described above, in the case of the first program circuit 20M, for example, a write data signal to be written into the first memory cell 1M and the activation signal ACT which controls turning on and off of the write switch 51M are inputted to the write switch 51M. Here, the write data signal and the activation signal ACT are inputted from separate terminals and are produced by use of separate input signals.

However, in the respective embodiments described above, a method for inputting the write data signal and the activation signal ACT is not limited to the one described above. The input method may be changed based on whether the cell has 1 bit of data or multiple bits of data. Specifically, the case of the first program circuit 20M, for example, will be described. If the first memory cell array 10M has multiple bits of data, as shown in FIG. 3, the write data signal and the activation signal ACT are produced by use of separate input signals from separate terminals X and Y. Meanwhile, if the first memory cell array 10M has 1 bit of data, the point P in FIG. 3 is electrically connected, and the write data signal and the activation signal ACT may be produced by use of one input signal from the same terminal X.

(d) In the respective embodiments described above, the write decoder 39M and the select gate decoder 45M which decode address signals in the write/read operations are used. However, the decoders are not limited to the ones configured as described above.

(e) Applications regarding the nonvolatile semiconductor memory according to the respective embodiments described above will be described below.

Figure 9:
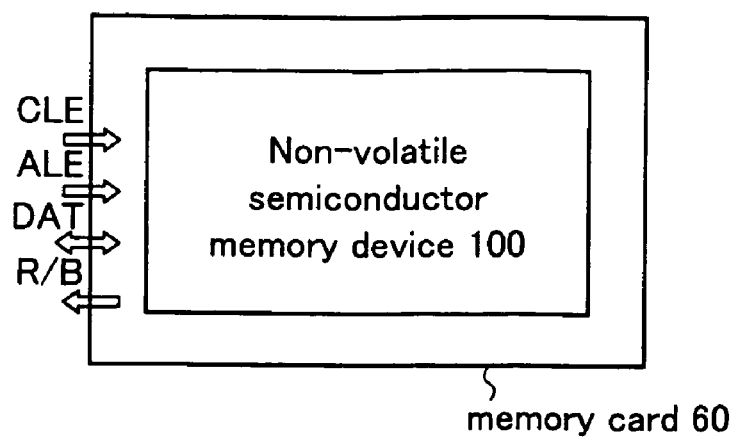
FIG. 9 shows a memory card incorporating a semiconductor memory device corresponding to one of embodiments of the present invention.

FIG. 9 shows an example of a memory card having the nonvolatile semiconductor memory according to the respective embodiments of the present invention.

As shown in FIG. 9, a memory card 60 includes a nonvolatile semiconductor memory 100 having the above-described characteristics. The nonvolatile semiconductor memory 100 receives a predetermined control signal and data from an unillustrated external device, and outputs a predetermined control signal and data to an unillustrated external device.

A signal line (DAT), a command line enable signal line (CLE), an address line enable signal line (ALE), and a ready/busy signal line (R/B) are connected to the nonvolatile semiconductor memory 100. The signal line (DAT) transfers a data signal, an address signal or a command signal. The command line enable signal line (CLE) transfers a signal indicating that the command signal is transferred to the signal line (DAT). The address line enable signal line (ALE) transfers a signal indicating that the address signal is transferred to the signal line (DAT). The ready/busy signal line (R/B) transfers a signal indicating whether or not the nonvolatile semiconductor memory 100 can be operated.

Figure 10:
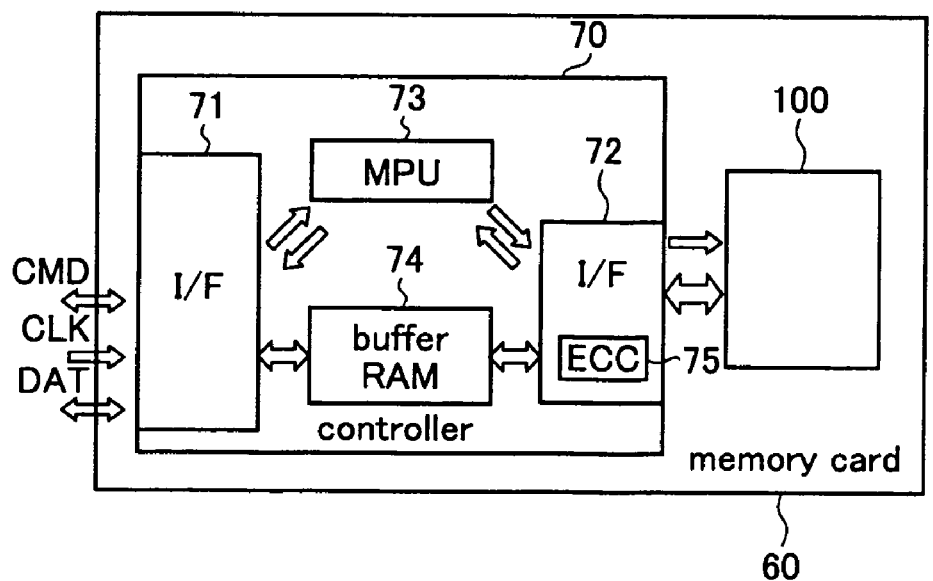
FIG. 10 shows a memory card incorporating the semiconductor memory device and a controller.

FIG. 10 shows another example of the memory card having the nonvolatile semiconductor memory according to the respective embodiments of the present invention.

A memory card 60 shown in FIG. 10 is different from the foregoing memory card 60 shown in FIG. 9 in controlling the nonvolatile semiconductor memory 100 and having a controller 70 which transmits/receives a predetermined signal to/from an unillustrated external device.

The controller 70 includes interface units (I/F) 71 and 72, a microprocessor unit (MPU) 73, a buffer RAM 74, and an error correction code unit (ECC) 75. The interface unit (I/F) 71 receives a predetermined signal from an unillustrated external device or outputs a predetermined signal to the external device. The interface unit (I/F) 72 transmits/receives signals to/from the nonvolatile semiconductor memory 100. The microprocessor unit (MPU) 73 performs a predetermined calculation for converting a logical address inputted from the external device into a physical address. The buffer RAM 74 temporarily stores data. The error correction code unit (ECC) 75 produces an error correction code. Moreover, a command signal line (CMD), a clock signal line (CLK), and a signal line (DAT) are connected to the memory card 60.

Note that, in the memory card 60 described above, as to the number of control signal lines, a bit width of the signal line (DAT) or the configuration of the controller 70, various modifications can be made.

Figure 11:
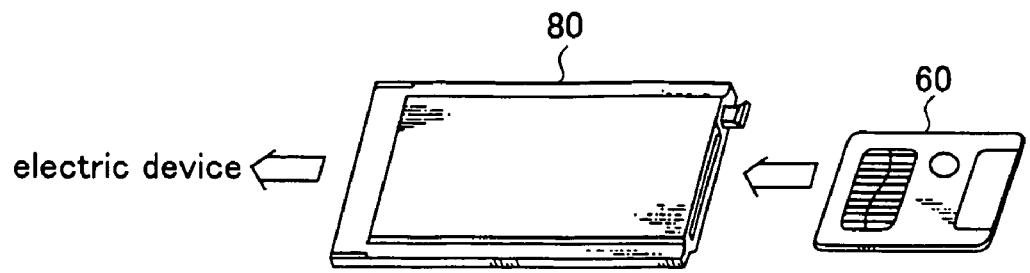
FIG. 11 shows a memory card holder, to which a memory card in inserted.

FIG. 11 shows an example of the memory card and a card holder, the memory card having the nonvolatile semiconductor memory according to the respective embodiments of the present invention.

As shown in FIG. 11, the memory card 60 is inserted into a card holder 80. This card holder 80 is connected to an unillustrated electronic device and functions as an interface between the electronic device and the memory card 60. Note that the card holder 80 may have a part of the functions of the controller 70 shown in FIG. 10.

Figure 12:
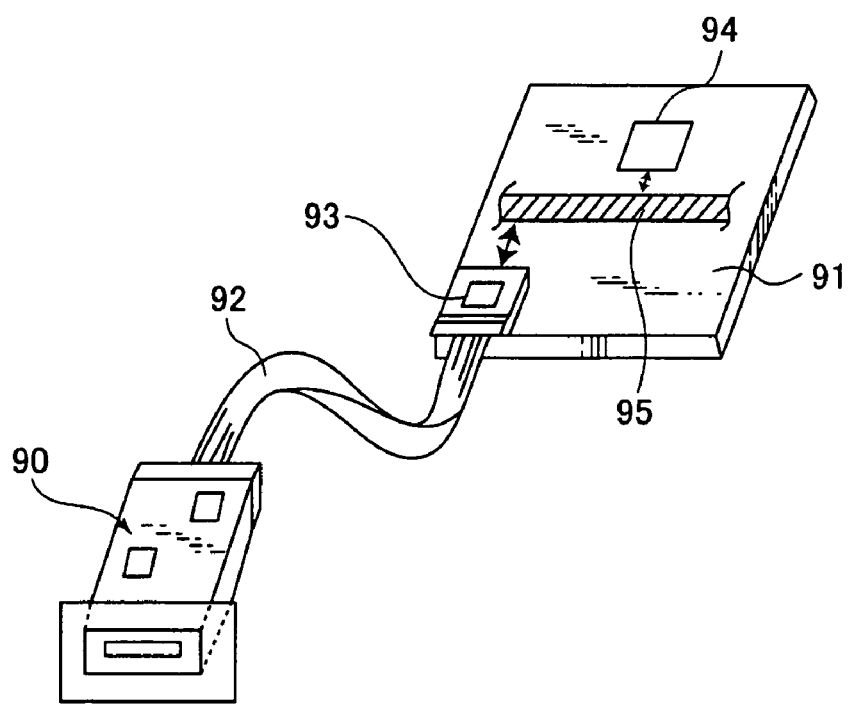
FIG. 12 is a view showing an example of a connection unit into which the memory card or the card holder is inserted, the memory card having the nonvolatile semiconductor memory according to the respective embodiments of the present invention.

FIG. 12 shows an example of a connection unit into which the memory card or the card holder is inserted, the memory card having the nonvolatile semiconductor memory according to the respective embodiments of the present invention.

As shown in FIG. 12, the memory card 60 or the card holder 80, into which the memory card 60 is inserted, is inserted into a connection unit 90. This connection unit 90 is connected to a board 91 through a connection wiring 92 and an interface circuit 93. The board 91 has a CPU (central processing unit) 94 and a bus 95.

Figure 13:
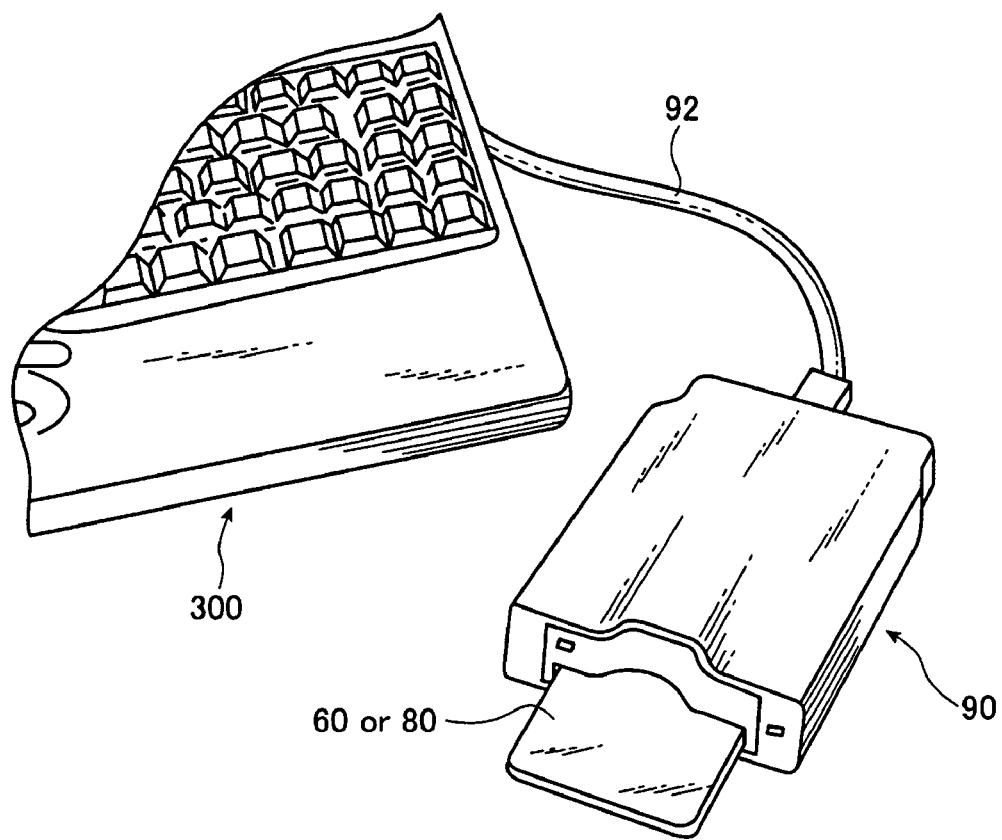
FIG. 13 is a view showing an example where the connection unit, into which the memory card or the card holder is inserted, is connected to a PC (personal computer), the memory card having the nonvolatile semiconductor memory according to the respective embodiments of the present invention.

FIG. 13 shows an example where the connection unit, into which the memory card or the card holder is inserted, is connected to a PC (personal computer), the memory card having the nonvolatile semiconductor memory according to the respective embodiments of the present invention.

As shown in FIG. 13, the memory card 60 or the card holder 80, into which the memory card 60 is inserted, is inserted into the connection unit 90. This connection unit 90 is connected to a PC (personal computer) 300 through the connection wiring 92.

Figure 14:
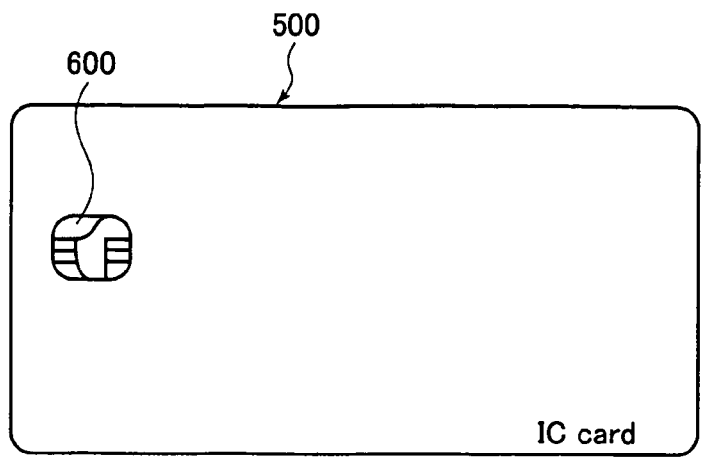
FIG. 14 is a view showing an example of an IC card having the nonvolatile semiconductor memory according to the respective embodiments of the present invention.
Figure 15:
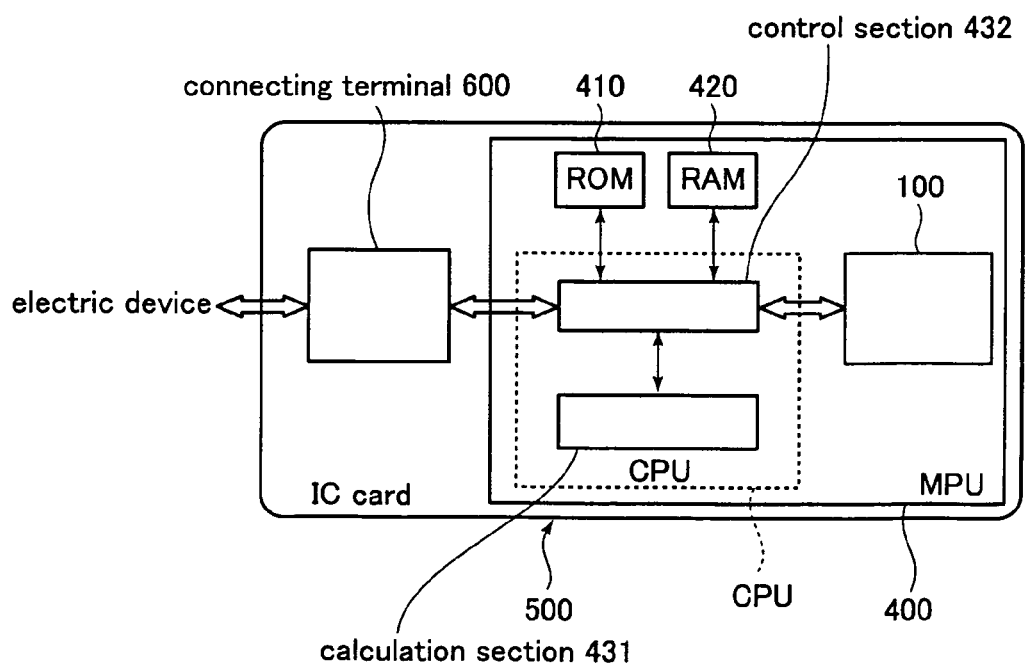
FIG. 15 is a view showing an example of an internal structure of the IC card having the nonvolatile semiconductor memory according to the respective embodiments of the present invention.

FIGS. 14 and 15 show an example of an IC card having the nonvolatile semiconductor memory according to the respective embodiments of the present invention.

As shown in FIGS. 14 and 15, an IC (integrated circuit) card 500 includes a MPU (microprocessing unit) 400 and a connection terminal 600. The MPU 400 includes the nonvolatile semiconductor memory 100, a ROM (read only memory) 410, a RAM (random access memory) 420, and a CPU (central processing unit) 430. The CPU 430 has an operating unit 431 and a control unit 432. The connection terminal 600 has an electrode to be connected to an external electronic device.

The MPU 400 of the IC card 500 is connected to the external electronic device through the connection terminal 600. The control unit 432 of the CPU 430 is connected to the nonvolatile semiconductor memory 100, the ROM 410 and the RAM 420. Note that the MPU 400 is disposed, for example, on a backside of the connection terminal 600.

The present invention is not limited to the respective embodiments described above. Various modifications can be made without departing from the scope of the invention in the implementation phase. Furthermore, the above-described embodiments include inventions of various stages, and various inventions can be derived from appropriate combinations in a plurality of disclosed structural requirements. For example, even if some of the structural requirements are removed from the entire structural requirements shown in the embodiments, the problems described in the section of the problems to be solved by the invention can be solved. Moreover, if the effects described in the section of the effects of the invention can be achieved, the configuration having such structural requirements removed therefrom can be derived as the invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended and their equivalents.

What is claimed is:

1. A semiconductor memory device comprising:
   a first memory cell array including a plurality of memory cells,
   a first switch circuit for transferring data to be programmed to at least one of the plurality of memory cells arranged in the first memory cell array,
   a latch circuit for latching the data transferred from the first switch circuit,
   a first write selector circuit for transferring the data transferred from the latch circuit,
   a first bit line connected to at least one of the plurality of memory cells and receiving the data transferred from the first write selector circuit,
   a second memory cell array including a plurality of memory cells that are different from the plurality of memory cells arranged in the first memory cell array,
   a second switch circuit for transferring data to be programmed to at least one of the plurality of memory cells arranged in the second memory cell array,
   a second write selector circuit connected to the second switch circuit and transferring the data transferred from the second switch circuit, and
   a second bit line connected to at least one of the plurality of memory cells arranged in the second memory cell array.

2. The semiconductor memory device according to claim 1, the second memory cell array stores an address information indicating where a defective memory cell arranged in the first memory cell array is.

3. The semiconductor memory device according to claim 1, the second memory cell array is used as a register circuit to set up a function of a LSI circuit that is provided outside the semiconductor memory device.

4. The semiconductor memory device according to claim 1, wherein one of the plurality of memory cells arranged in the first memory cell array is one of first, second, and third type memory cells, the first type memory cell being comprised of a first nonvolatile memory cell connected to the first bit line, and a first transfer transistor connected to the first nonvolatile memory cell and a first voltage supply line, the second type memory cell being comprised of a second transfer transistor connected to the first bit line, and a second nonvolatile memory cell connected to the second transfer transistor and a second voltage supply line, and the third type memory cell being comprised of a third nonvolatile memory cell connected to the first bit line and a third voltage supply line.

5. The semiconductor memory device according to claim 1, wherein one of the plurality of memory cells arranged in the second memory cell array is one of fourth, fifth, and sixth type memory cells, the fourth type memory cell being comprised of a fourth nonvolatile memory cell connected to the second bit line, and a third transfer transistor connected to the fourth nonvolatile memory cell and a fourth voltage supply line, the fifth type memory cell being comprised of a fourth transfer transistor connected to the second bit line, and a fifth nonvolatile memory cell connected to the fourth transfer transistor and a fifth voltage supply line, and the sixth type memory cell being comprised of a sixth nonvolatile memory cell connected to the second bit line and a sixth voltage supply line.

6. The semiconductor memory device according to claim 1, wherein a capacity of the first memory cell array is greater than that of the second memory cell array.

7. A memory card including the semiconductor memory device recited in claim 1.

8. A semiconductor memory device including first and second regions comprising:
   the first region having a plurality of groups, each of which including 1) a first memory cell array including a plurality of memory cells, 2) a first readout circuit receiving data read out from the first memory cell array, 3) a first program circuit receiving a first data to be programmed to the plurality of memory cells arranged in the first memory cell array, and 4) a first decoder circuit controlling the first memory cell array, and
   the second region having at least one group having 1) a second memory cell array including a plurality of memory cells, 2) a second readout circuit receiving data read out from the second memory cell array, 3) a second program circuit receiving a second data to be programmed to the plurality of memory cells arranged in the second memory cell array, and 4) a second decoder circuit controlling the second memory cell array, wherein the first program circuit including 1) a plurality of first switch circuits receiving the first data to be programmed to the plurality of memory cells arranged in the first memory cell array, 2) a plurality of latch circuits storing temporally the first data transferred from the plurality of first switch circuits, and 3) a plurality of first write selector circuits receiving the first data transferred from the plurality of latch circuits, wherein the second program circuit including 1) a plurality of second switch circuits receiving the second data to be programmed to the plurality of memory cells arranged in the second memory cell array and 2) a plurality of second write selector circuits, each of which is connected to corresponding each of the plurality of second switch circuits.

9. The semiconductor memory device according to claim 8, the second memory cell array is used as a register circuit to set up a function of a LSI circuit that is provided outside the semiconductor memory device.

10. The semiconductor memory device according to claim 8, wherein one of the plurality of memory cells arranged in the first memory cell array is one of first, second, and third type memory cells, the first type memory cell being comprised of a first nonvolatile memory cell connected to the first bit line, and a first transfer transistor connected to the first nonvolatile memory cell and a first voltage supply line, the second type memory cell being comprised of a second transfer transistor connected to the first bit line, and a second nonvolatile memory cell connected to the second transfer transistor and a second voltage supply line, and the third type memory cell being comprised of a third nonvolatile memory cell connected to the first bit line and a third voltage supply line.

11. The semiconductor memory device according to claim 8, wherein one of the plurality of memory cells arranged in the second memory cell array is one of fourth, fifth, and sixth type memory cells, the fourth type memory cell being comprised of a fourth nonvolatile memory cell connected to the second bit line, and a third transfer transistor connected to the fourth nonvolatile memory cell and a fourth voltage supply line, the fifth type memory cell being comprised of a fourth transfer transistor connected to the second bit line, and a fifth nonvolatile memory cell connected to the fourth transfer transistor and a fifth voltage supply line, and the sixth type memory cell being comprised of a sixth nonvolatile memory cell connected to the second bit line and a sixth voltage supply line.

12. The semiconductor memory device according to claim 8, wherein a capacity of the first memory cell array is greater than that of the second memory cell array.

13. A memory card including the semiconductor memory device recited in the claim 8.

14. A method for programming data to a semiconductor memory device comprising:
receiving at least two data from outside of the semiconductor memory device,
transferring the at least two data to latch circuits,
retaining the at least two data in the latch circuits,
programming the at least two data that are retained in the latch circuits, to first memory cells arranged in a first memory cell array at one time,
receiving a second data from outside of the semiconductor memory device,
transferring the second data, and
programming the second data to a second memory cell arranged in a second memory cell array without waiting an arrival of another data to be programmed to the second memory cell array, wherein a capacity of the first memory cell array is greater than that of the second memory cell array.

15. The method for programming data to a semiconductor memory device according to claim 14, wherein the transferring the second data is performed based on a first control signal output from a decoder circuit.

16. A method for programming data to a semiconductor memory device comprising:
receiving a first data from outside of the semiconductor memory device,
transferring the first data to a latch circuit,
retaining the first data in the latch circuit,
programming the first data that is retained in the latch circuit, to a first memory cell arranged in a first memory cell array,
receiving a second data from outside of the semiconductor memory device,
transferring the second data, and
programming the second data to a second memory cell arranged in a second memory cell array without waiting an arrival of another data to be programmed to the second memory cell array, wherein a capacity of the first memory cell array is greater than that of the second memory cell array.

17. The method for programming data to a semiconductor memory device according to claim 16, wherein the transferring the second data is performed based on a first control signal output from a decoder circuit.

18. A method for programming data to a semiconductor memory device comprising:
receiving a first data from outside of the semiconductor memory device,
transferring the first data to a latch circuit,
retaining the first data in the latch circuit,
programming the first data that is retained in the latch circuit, to a first memory cell arranged in a first memory cell array,
receiving a second data from outside of the semiconductor memory device to a switch circuit,
transferring the second data from the switch circuit to a write selector circuit directly, and
programming the second data to a second memory cell arranged in a second memory cell array, wherein a capacity of the first memory cell array is greater than that of the second memory cell array.

19. The method for programming data to a semiconductor memory device according to claim 18, wherein the transferring the second data is performed based on a first control signal output from a decoder circuit.

* * * * *